United States Patent
Schluchter et al.

(10) Patent No.: US 7,130,056 B2
(45) Date of Patent: Oct. 31, 2006

(54) SYSTEM AND METHOD OF USING A SIDE-MOUNTED INTERFEROMETER TO ACQUIRE POSITION INFORMATION

(75) Inventors: William Clay Schluchter, Los Altos, CA (US); Louis F. Mueller, Palo Alto, CA (US); Douglas P. Woolverton, Mountain View, CA (US); Jeffrey A. Young, Campbell, CA (US); Alan B. Ray, Palo Alto, CA (US); David C. Chu, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 279 days.

(21) Appl. No.: 10/783,199

(22) Filed: Feb. 20, 2004

(65) Prior Publication Data

US 2005/0185193 A1    Aug. 25, 2005

(51) Int. Cl.
    *G01B 11/02*    (2006.01)
(52) U.S. Cl. ..................................... 356/500
(58) Field of Classification Search ................ 356/486, 356/487, 492, 493, 498, 500, 508
    See application file for complete search history.

(56) References Cited

U.S. PATENT DOCUMENTS

| | | | |
|---|---|---|---|
| 4,891,526 A | 1/1990 | Reeds | |
| 5,717,482 A | 2/1998 | Akutsu et al. | |
| 6,020,964 A * | 2/2000 | Loopstra et al. | ............ 356/500 |
| 6,208,407 B1 | 3/2001 | Loopstra | |
| 6,650,419 B1 | 11/2003 | Hill | |
| 6,674,510 B1 | 1/2004 | Jasper et al. | |
| 6,700,667 B1 * | 3/2004 | Nishi | ......................... 356/509 |

* cited by examiner

*Primary Examiner*—Gregory J. Toatley, Jr.
*Assistant Examiner*—Michael A. Lyons

(57) ABSTRACT

A system and method for acquiring position information of a movable apparatus relevant to a specific axis is disclosed. In one embodiment, an interferometer generates first and second beams and various beam-steering members are located to define beam path segments for the two beams, but no beam path segment varies in length in unity with displacements of the movable apparatus along the specific axis. In another or the same embodiment, each beam path segment in which the first beam either impinges or has been reflected from the movable apparatus is symmetrical to a corresponding beam path segment of the second beam. The movable apparatus may be a wafer stage in which the "specific axis" is the exposure axis of a projection lens, but with all optical members which cooperate with the stage being located beyond the ranges of the wafer stage in directions perpendicular to the lithographic exposure axis.

21 Claims, 6 Drawing Sheets

SYSTEM AND METHOD OF USING A SIDE-MOUNTED INTERFEROMETER TO ACQUIRE POSITION INFORMATION

BACKGROUND ART

In various applications, it is necessary to acquire precise information regarding the position of an object. The object of interest may be fixed in position or may be a movable one. By way of example, positioning systems and measuring systems that are used in the integrated circuit fabrication industry must have a high level of accuracy. Prior to wafer dicing, an array of identical integrated circuits is formed on a semiconductor wafer by stepping the wafer relative to a system or system component, such as an image-bearing reticle. Often, both the reticle and the wafer are connected to stages which are movable. As used herein, a "wafer stage" includes both an apparatus for supporting the wafer and/or the apparatus for supporting the reticle.

A typical wafer stage is movable in perpendicular X and Y directions. The wafer stage can therefore be stepped after each exposure of the wafer. For example, in the use of a reticle, a photoresist layer may be repetitively exposed onto a wafer by projecting an image of the reticle through a projection lens to one area on the wafer, stepping the wafer stage, and repeating the exposure. The wafer is scanned using the X and Y movements of the wafer stage until each integrated circuit region is properly exposed. In addition to the movements in the X and Y directions, Z axis movement is enabled. In wafer lithography, the Z axis may also be considered the exposure optical axis or the "focus" axis. The required range of motion in the Z direction is significantly less than the necessary ranges in the X and Y directions.

Acquiring position information regarding movement of a wafer stage in the Z direction is somewhat more problematic than acquiring such information for X and Y movements. An approach to providing Z axis measurements is to use an encoder that employs interferometric techniques. One concern with this approach is that interferometer components must be relatively large in order to capture the diffracted orders as the stage translates through its full range, since the required diffraction angle must be relatively great in order to achieve the target accuracy. As an alternative, a standard Michelson interferometer may be used to monitor Z axis motions. However, if the measurement is performed from the projection lens side of the wafer stage, the percentage of stage real estate that is available to the wafer or reticle must be smaller (for a given size stage), since the laser light from the interferometer should not impinge the wafer or reticle. On the other hand, if the measurement is performed from the side of the stage opposite to the projection lens, the measurement system must use an intermediate reference, such as the stone below the stage. Among other potential disadvantages, this requires a separate measurement of the stone relative to the projection lens.

FIG. 1 illustrates another approach to acquiring position information of a wafer stage 10 along a Z axis. This approach is described in detail in U.S. Pat. No. 6,208,407 to Loopstra. A wafer 12 is shown as being supported on the stage for exposure by projection optics or exposure tool 14. The advantage of this approach is that although the interferometer 16 is positioned at the side of the stage 10, accurate Z axis measurements may be obtained. This is enabled by properly positioning mirrors which establish a Z measuring axis 18 that is parallel to the Z axis 20 of the exposure system. A first mirror 22 is arranged at a forty-five degree angle to movement of the stage 10 along the X or Y direction. A measuring beam 24 from the interferometer impinges the forty-five degree mirror to establish the Z measuring axis 18. A horizontal mirror 26 is attached to structure 28 of the exposure system, so that the beam is redirected to the first mirror 22, which reflects the returned beam to the interferometer 16. In addition to the measuring beam 24, the interferometer projects a test beam 30 for reflection from a vertical surface 31 of the stage 10.

As can be seen in FIG. 1, movement of the wafer stage 10 along the Z axis 20 will result in a change in the length of the beam path segment from the forty-five degree mirror 22 to the horizontal mirror 26. Thus, while the interferometer 16 is located at the side of the stage, the measuring beam 24 has a path segment that varies in length in unity with Z axis displacements of the stage. In fact, the reflection from the horizontal mirror 26 to the forty-five degree mirror provides a second beam path segment that varies in unity with Z axis movement of the stage. On the other hand, the length of each beam path segment for the test beam 30 is fixed, unless the stage 10 is moved in the X direction.

While the approach described with reference to FIG. 1 operates well for its intended purposes, there are cost concerns, since the horizontal mirror 26 is a relatively large reflective component that requires a high degree of planarity. Moreover, as the linewidths of the features of integrated circuits decrease, the size of the projection lens of the projection optics 14 increases. In FIG. 1, this would result in an increase of the diameter of the projection optics. As a consequence, the requirement of a horizontal mirror 26 to accommodate the entire range of motion of the stage imposes a potential difficulty with respect to achieving further reductions of linewidths.

For systems in which the increase in size of a projection lens is not an issue, there may be other reasons for avoiding the use of a horizontal mirror of a similar type and orientation of FIG. 1.

SUMMARY OF THE INVENTION

A system for acquiring position information of a movable apparatus relevant to a specific axis is achieved without requiring either an interferometer or its beam-steering members to be located in a position that would affect performance or design flexibility of the overall system in which the movable apparatus is a component. For example, where the movable apparatus is a wafer stage and the specific axis is the vertical Z axis, the beam-steering members of the system for acquiring position information are neither directly above nor directly below the wafer stage.

In accordance with one embodiment of the invention, the system includes a movable apparatus having first and second reflective faces, an interferometer positioned to direct beams for impingement of the reflective faces, and beam-steering members located with respect to the interferometer and reflective faces to manipulate the reflected beams to reach a beam combiner without requiring a beam path segment that varies in length in unity with displacements of the movable apparatus along the axis. The movable apparatus may be a "wafer stage" on which a wafer or reticle is mounted for movement between steps of integrated circuit fabrication. In this application, the "specific axis" is the Z axis (i.e., the lithography optical axis) and the reflective faces are on the side of the wafer stage associated with a parallel to the Z axis. However, the first and second reflective faces are non-parallel to the Z axis itself.

In order to control "walk-off" of the first beam relative to the second beam upon reaching the beam combiner, the angles of the first and second reflective faces and the positions and angles of the beam-steering members are preferably selected such that the two beam paths vary in opposition when the movable apparatus is displaced along the axis for which the position information is being acquired. The interferometer may be configured to direct the first and second beams at a generally perpendicular angle with respect to displacement of the movable member along the specific axis, with the first and second reflective faces being oppositely sloped as measured with respect to the perpendicular angle. The beam-steering members may include first and second beam-return mirrors that are respectively located in alignment with the first and second reflective faces to cause the beams to retrace (e.g., plane mirrors) or to parallel (e.g., roof mirrors) their original beam path segments in returning to the interferometer.

In accordance with the method of utilizing the interferometric system to acquire the position information, the first and second beams are generated and directed toward the movable apparatus. As previously noted, the beams may both be at ninety degrees to the specific axis. The two beams are manipulated via reflections such that each beam path segment in which the beam either impinges or is reflected by the movable apparatus is symmetrical to a corresponding beam path segment for the other beam, if the movable member is in its beam symmetry position along the specific axis. However, as the movable apparatus is displaced from its beam symmetry position, at least some of the beam path segments will be changed in length, thereby providing the basis for interferometrically determining the position information. The two beams have different optical characteristics (e.g., frequency and/or polarization), allowing the employment of standard interferometric techniques.

The system and method enable all optical members that are mounted to a wafer stage to remain beyond the ranges of the wafer stage movements in the X and Y directions, even if the wafer stage is considered to move beyond its possible range of motion in the Z direction. Consequently, the locations of the optical members are unlikely to affect design considerations of other aspects of the overall system in which the invention resides.

DETAILED DESCRIPTION

Figure 2:
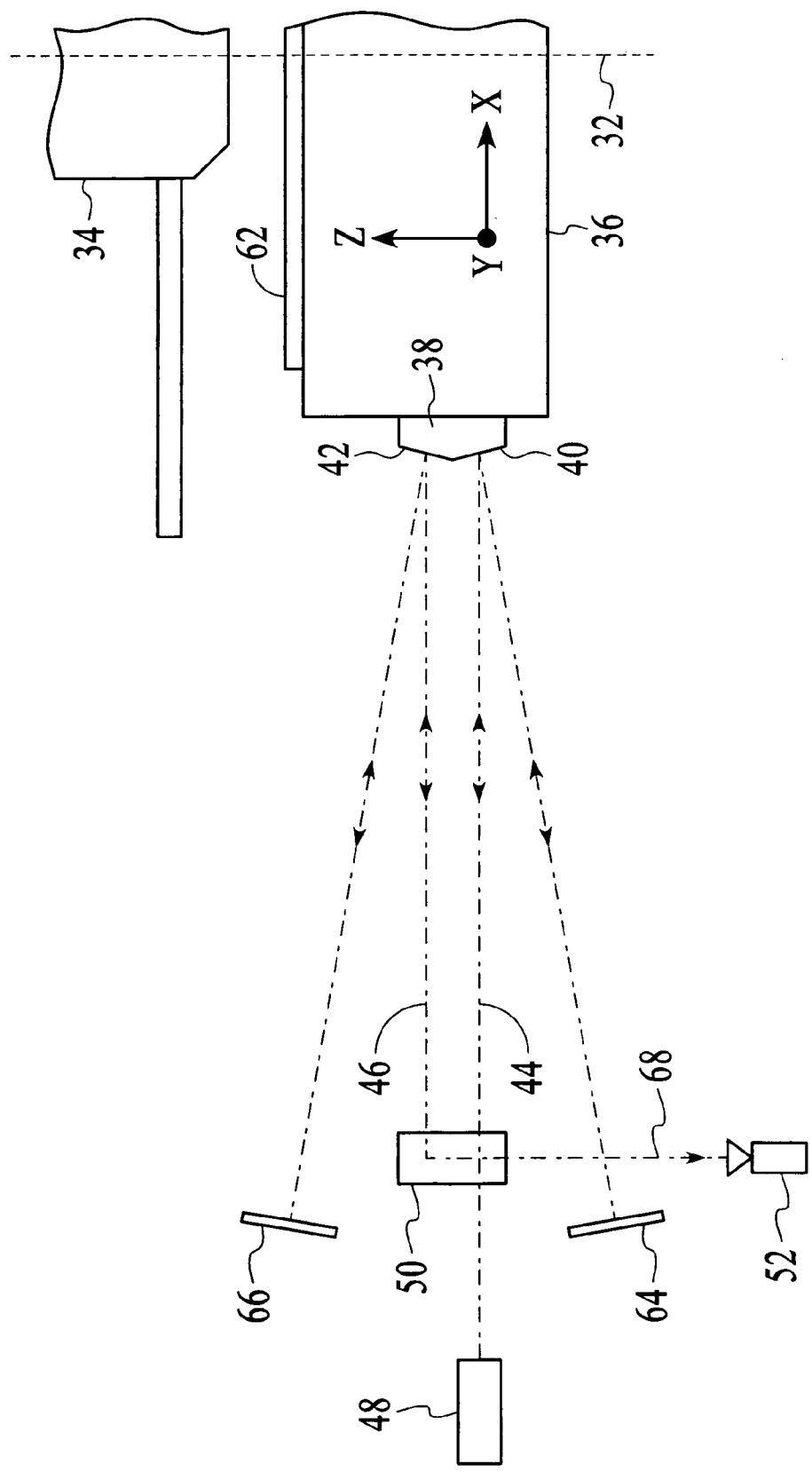
FIG. 2 is a side view of a system for acquiring position information in accordance with one embodiment of the invention.

A system for acquiring position information relevant to a specific axis will be described as being used within a lithography environment. However, the invention may be used in other applications. The system is best suited for applications in which the range of movement is relatively minor, compared to a range in motion in either or both of the perpendicular axes. In FIG. 2, the system may be used to monitor motion along a vertical Z direction, which is aligned with the exposure optical axis 32 (or "focus" axis) of a lithography system 34. In this particular application, the movable apparatus includes a wafer stage 36 and a prism reflector 38 having a first reflective face 40 and a second reflective face 42. As previously noted, the term "wafer stage" is defined herein as including stages which support a reticle of the lithography system, but at the upper portion of the system, rather than the lower portion shown in FIG. 2. It should be noted that the lithography system can be rotated, so that the axis is no longer vertical.

The position acquisition system includes a source of a first beam 44 and a second beam 46. As one possibility, the source comprises a laser 48 and a beam splitter and recombiner 50. As will be described more fully below, the recombined beams are directed to a detector 52. The laser 48, splitter and recombiner 50, and detector 52 are components of an interferometer. The first and second beams may have different frequencies and polarizations, wherein the different polarizations facilitate separation and recombination of the beams, and wherein the different frequencies facilitate the measurements of beam path lengths, thereby providing the basis for detecting and/or quantifying movements.

Figure 3:
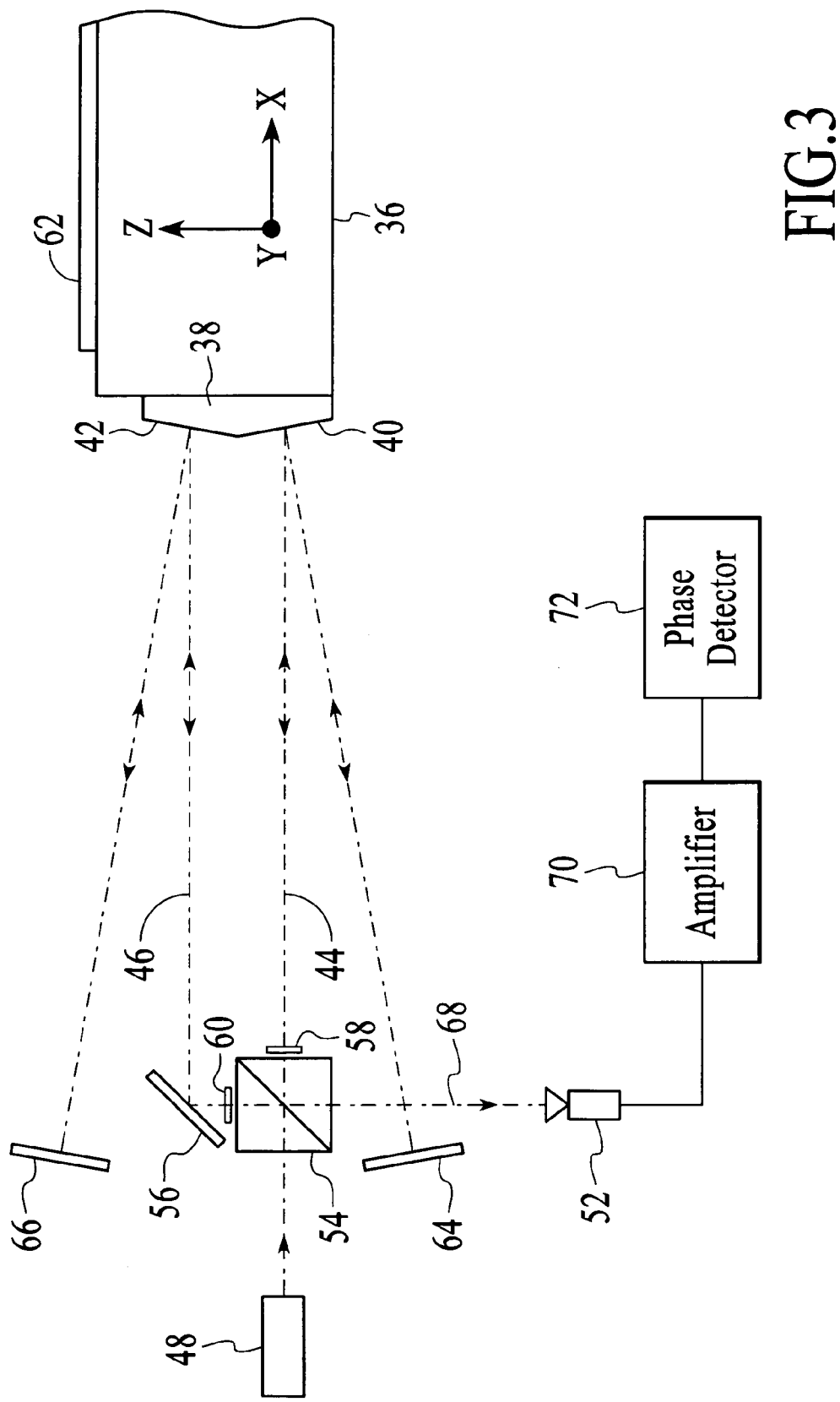
FIG. 3 is a side view of one possible combination of optical components for splitting and recombining beams of the system of FIG. 2.

Merely by way of example, FIG. 3 shows a more detailed arrangement of possible components for implementing the interferometer. The laser 48 may be a standard two-frequency optical laser. The frequency difference can be generated in a number of ways, including, but not limited to, Zeeman split or acousto-optic modulation. A Helium-Neon laser may be used to provide a beam having orthogonal polarized components with a frequency difference.

The beam from the laser 48 enters a beam splitter 54 that is polarization sensitive. The first beam 44 having a particular frequency and polarization passes through the beam splitter, while the second beam 46 having a different frequency and a different polarization is internally reflected toward a mirror 56 of the interferometer.

Upon exiting from the beam splitter 54, the first and second beams 44 and 46 pass through quarter-wave plates 58 and 60, respectively. Each quarter-wave plate provides circular polarization.

The two beams 44 and 46 are directed toward the stage 36 having the mounted wafer 62 at angles less than forty-five degrees relative to the Z axis. In the embodiment of FIG. 3, the angle is ninety degrees relative to the Z axis. Therefore, the angles of the first and second reflective faces 40 and 42 of the prism reflector 38 should be less than forty-five degrees to the incoming beam path. An angle of forty-five degrees or greater would result in a reflection that carries the concerns and disadvantages of prior approaches.

The first and second reflective faces 40 and 42 of the prism reflector 38 determine the angles of the next beam path segments. A pair of beam-steering members 64 and 66 is located to again reflect the two beams. Since the reflection is back to the wafer stage, the two optical members may be referred to as beam-return mirrors.

The second reflections from the prism reflector 38 direct the first and second beams 44 and 46 back to the interferometer. Each beam follows its original path to the interferometer, where the second beam 46 is again reflected by the interferometer mirror 56. Upon transition through the two quarter-wave plates 58 and 60, the orientations of the two polarizations are such that the first beam 44 is now reflected and the second beam 46 is now propagated without reflection through the beam splitter 54. This produces a combined beam 68 that exits the splitter at its lower port in order to reach the detector 52. Any detector conventionally used in interferometry may be employed. For example, the detector may be a photodiode connected to a conventional amplifier 70 and phase detector 72. As is well known in the art, shifts in phase may be used to acquire position information regarding stage displacement.

Returning to FIG. 2, the wafer stage 36 may be considered to be currently in a "symmetry position," since each of the four beam path segments of the first beam 44 involving contact with the reflective face 40 is symmetrical to a corresponding beam path segment of the second beam 46. That is, in comparing the propagations of the first and second beams, the path lengths between the interferometer 50 and the prism reflector 38 are equal and the path lengths between the prism reflector and the beam-steering mirrors 64 and 66 are equal. However, as the wafer stage 36 is moved upwardly or downwardly along the Z axis, the lengths of the path segments will vary in opposition. Downward movement of the wafer stage will cause the four relevant path segments for the first beam 44 to decrease in length, since the first reflective face 40 is sloped accordingly. On the other hand, the opposite slope of the second reflective face 42 causes the four beam path segments to lengthen with the downward movement. Upward movement of the wafer stage 36 increases the lengths of the path segments for the first beam, but decreases the path segments for the second beam. As can be readily understood, the total length change for each beam path is multiplied by a factor of four, since four path segments vary uniformly. As a result of the multiplication of length variations, the phase detection processing performed on the combined beam 68 may be used to precisely measure the displacements of the wafer stage 36.

Figure 4:
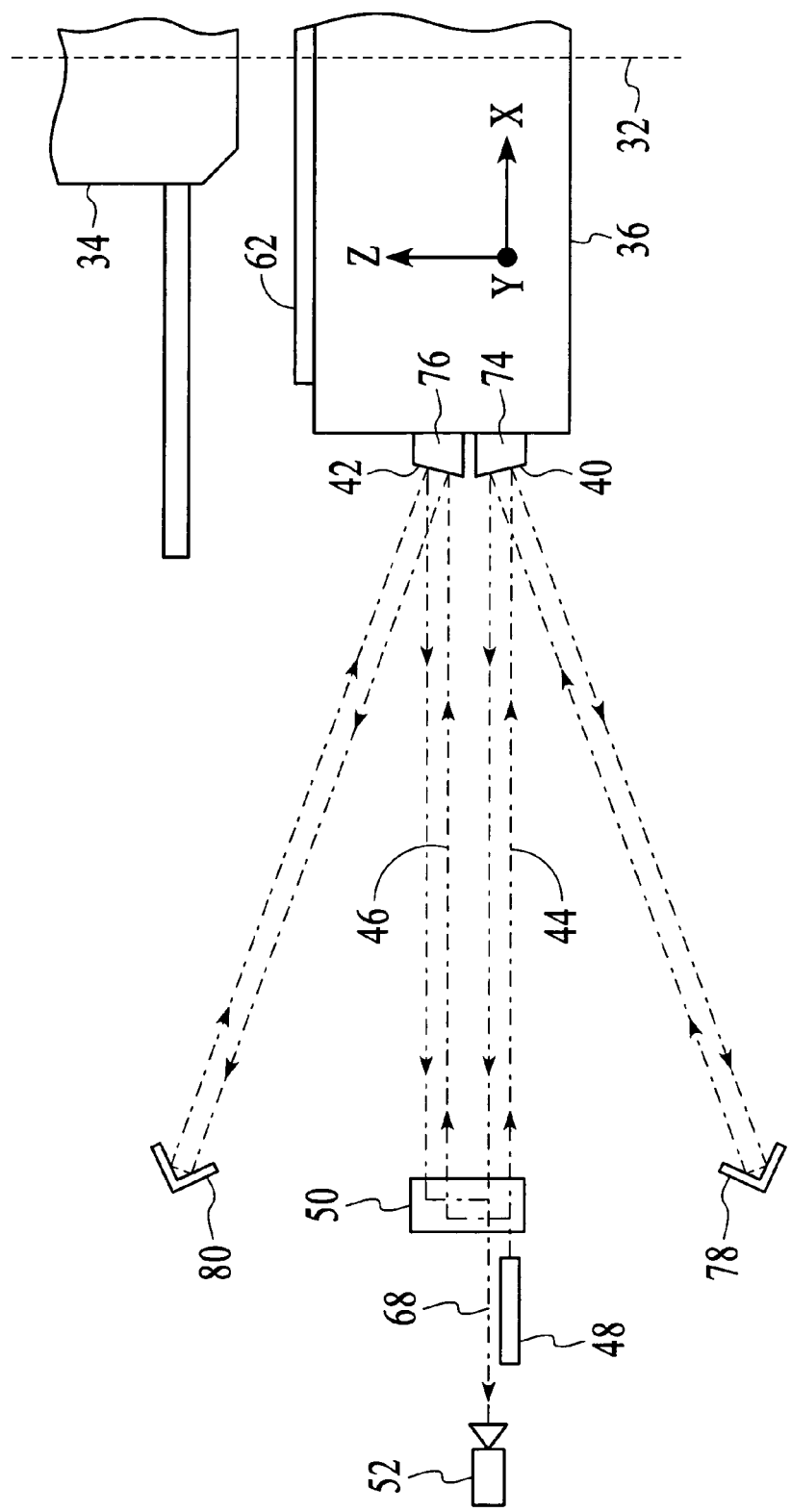
FIG. 4 is a side view of another embodiment of the invention, using roof mirrors and a divided prism.

Referring now to FIG. 4, another embodiment of the invention is illustrated. In this embodiment, a pair of reflectors 74 and 76 takes the place of the single prism reflector of FIGS. 2 and 3. However, the two oppositely sloped reflective faces 40 and 42 are still provided. A more significant difference is that rather than using plane mirrors to provide the beam steering, a pair of roof mirrors 78 and 80 is utilized. A roof mirror may consist of two mirrors joined together at ninety degrees. The roof mirrors are in any orientation that establishes symmetrical beam segments. In some applications, the symmetry requirement is somewhat relaxed, but in such applications there can be no beam path segment that varies in length in unity with displacements of the movable apparatus (such as the wafer stage 36) along the axis of interest (such as the Z axis).

The operations of the position information acquisition system of FIG. 4 are generally identical to those of the embodiment of FIG. 2. However, the beam return paths for the first and second beams 44 and 46 will be slightly spaced from the original beam propagation paths. Nevertheless, because the two reflective faces 40 and 42 are oppositely sloped and the roof mirrors are properly oriented, the four beam path segments in which the first beam 44 either impinges or has been reflected from the reflective face 40 will be symmetrical to the corresponding beam path segments for the second beam 46, when the wafer stage 36 is in its symmetry position. Moreover, any movement by the stage along its Z axis will cause the two beam paths to vary in opposition.

The interior configuration (not shown) of the beam splitter and recombiner 50 is designed to recombine the two incoming beams to form a single beam 68 directed to the detector 52. Then, conventional techniques may be used to acquire position information regarding the wafer stage 36.

Figure 5:
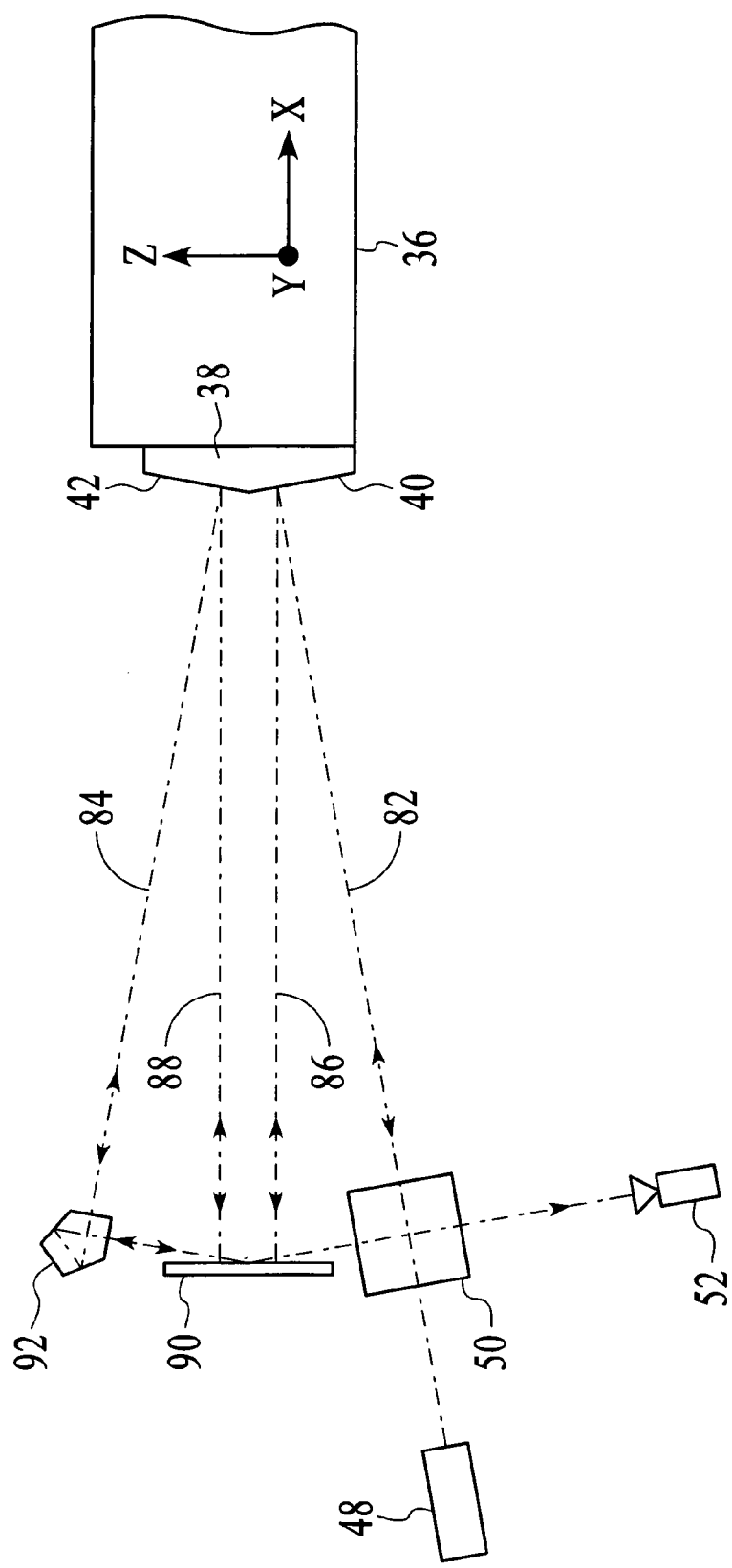
FIG. 5 is a third possible embodiment of the invention.

FIG. 5 shows another embodiment of the invention. As with FIG. 4, components that are identical to those described with reference to other embodiments are provided with the same reference numerals. A laser 48 provides the input to a beam splitter and recombiner 50. By operation of the beam splitter, first and second beams are provided with a difference in either or both of frequency and polarization.

Similar to the embodiments of FIGS. 2, 3 and 4, each of the two beams follows a path that includes four path segments that either impinge or have been reflected by the associated reflective face 40 and 42. Reference numeral 82 represents two of these beam segments for the first beam, while reference numeral 84 represents the two corresponding beam segments for the second beam. In similar manner, the reference numeral 86 represents the other two beam segments for the first beam (where contact is made with the reflective face 40) and reference numeral 88 represents the corresponding two segments for the second beam. When the wafer stage is in its beam symmetry position, the combination of beam segments 82 and 86 will be symmetrical with the combination of beam segments 84 and 88.

The first beam exits from the beam splitter and recombiner 50 and is directed toward the reflective face 40, along the beam segment represented by reference numeral 82. In comparison, the second beam exits from the upper port of the beam splitter and recombiner and is reflected by a plane mirror 90 before reaching a penta mirror 92. Alternatively, mirror 90 is a roof mirror. The second beam is manipulated by the penta mirror to provide the initial beam path segment to the reflective face 42. The second and third beam path segments for both beams are provided by the return reflections between the reflective faces and the plane mirror 90. Finally, the fourth beam segments are coaxial with the first segments for the same beams. Consequently, the two beams are recombined and directed to the detector 52.

Figure 6:
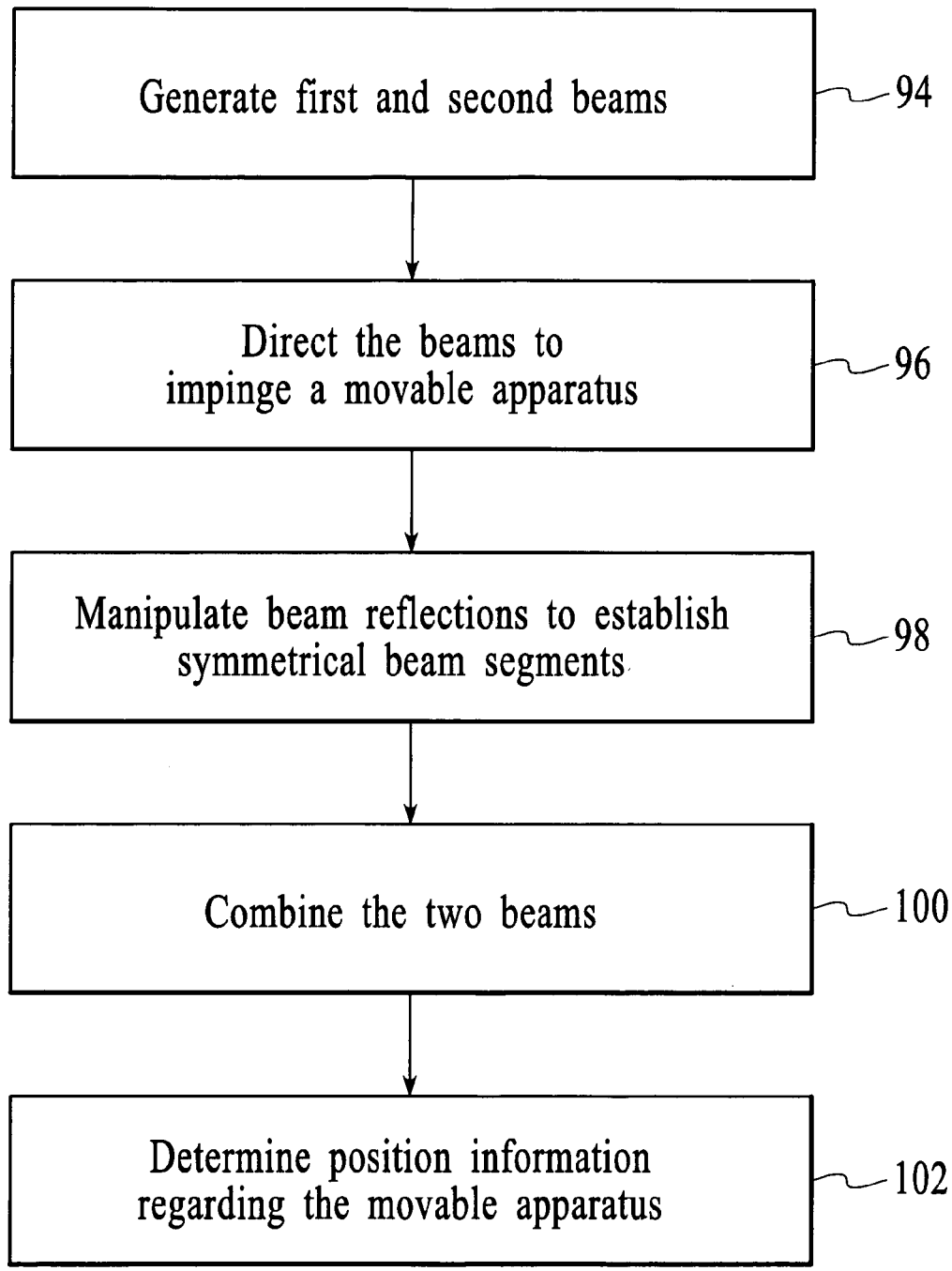
FIG. 6 is a process flow of steps for utilizing the systems of FIGS. 2–5.

Referring now to FIG. 6, a process flow of steps for implementing the invention in accordance with one embodiment includes the step 94 of generating first and second beams. The two beams are distinguishable with respect to either or both of frequency or polarization. It is likely that performance is maximized when the beams have different frequencies and orthogonal polarizations. The two beams may be generated using separate lasers, or the above-described techniques for beam splitting may be used.

At step 96, the two beams are directed to impinge a movable apparatus, such as a wafer stage. In FIG. 2, both beams 44 and 46 are directed by the interferometer, but FIG. 5 shows an embodiment in which the second beam is directed at the movable apparatus only after reflections from a plane mirror 90 and a penta mirror 92.

In step 98, beam reflections are used to establish symmetrical beam segments. In some applications, the symmetry requirement is somewhat relaxed, but in such applications there can be no beam path segment that varies in length in unity with displacements of the movable apparatus along the specific axis of interest. As the movable apparatus is displaced along the specific axis, the symmetry will be affected, since the beam path segments for one beam will lengthen while the path segments for the other beam will be reduced in length. Nevertheless, the differences in lengths of individual segments will be relatively minor, so that the associated path segments remain "generally symmetrical."

The two beams are combined at step 100. Conventional techniques may be employed. Then, at step 102, position information is determined regarding the movable apparatus. As previously noted, phase detection may be used in acquiring the position information.

While the illustrated embodiments of the invention utilize plane mirrors, roof mirrors and penta mirrors, other reflective components may be substituted. Moreover, other types of beam-return "mirrors" may be employed, including refractive components, diffractive components, and holographic components.

One advantage of the invention results directly from the first and second reflective faces being located on a side of the movable apparatus associated with a parallel to the specific axis. In some applications of the invention, this has significant consequences. For example, in the movement of a wafer stage during fabrication processing, any remaining limitations on design are imposed by non-measurement related factors. The optical members that cooperate with the reflective faces remain beyond the ranges of the wafer stage as it is moved in directions perpendicular to the exposure axis. Thus, the optical members do not interfere with other considerations.

In lithography and other possible optical applications, air showers are provided for purposes such as cooling and reducing the risk of contamination by settling particles. Uniformity of the air shower can be important, since disruptions in the air shower can cause fluctuations in the index of refraction of air. These fluctuations in the index can in turn cause fluctuations in the optical phase measured by a laser interferometer, leading to interferometer measurement error. It is believed that another advantage of the present invention is that, as compared to prior art techniques for acquiring the desired position information, the likelihood of a uniform air shower is increased.

Figure 1:
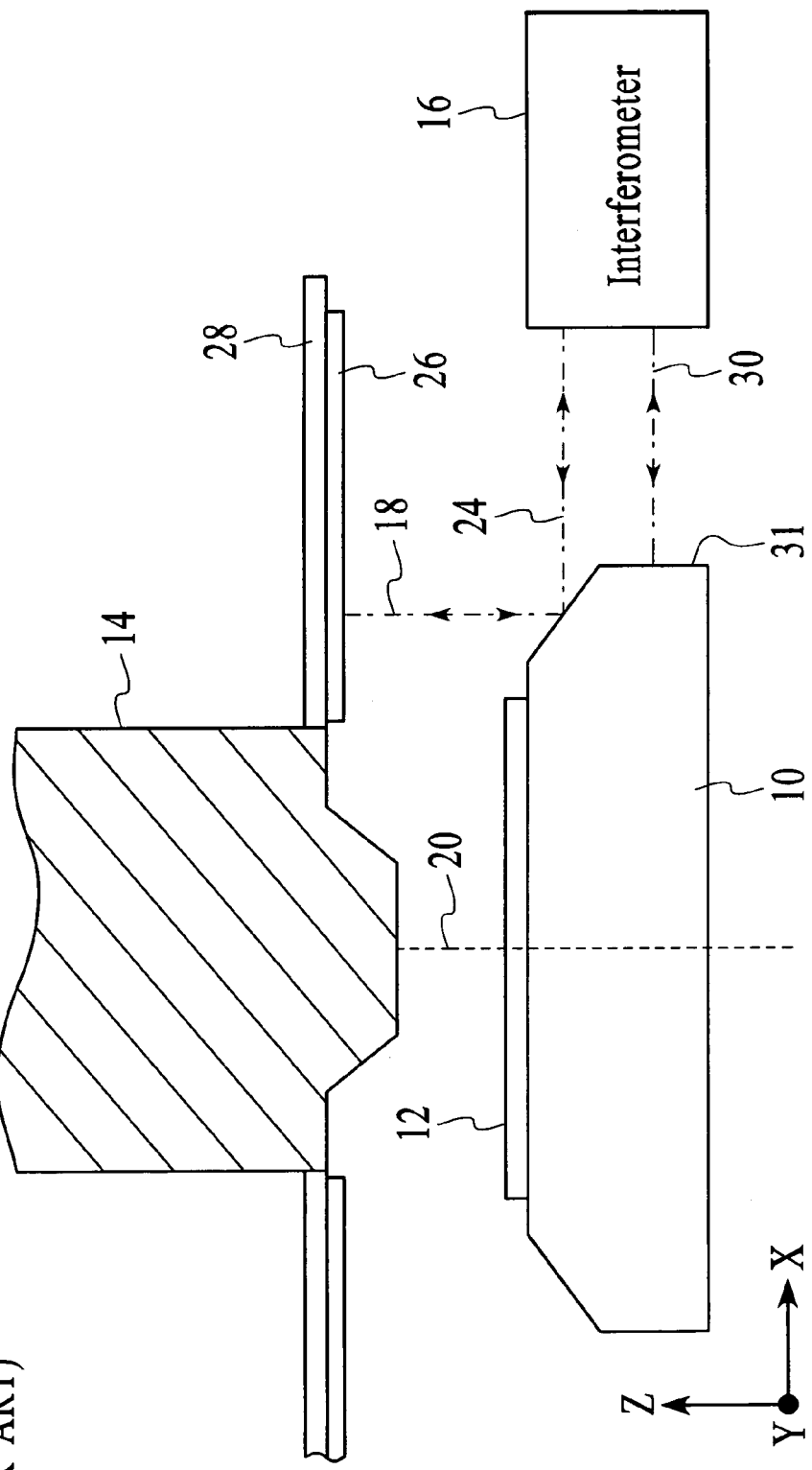
FIG. 1 is a side view of a prior art system for acquiring position information relevant to a specific axis.

One prior art approach to determining movement of a wafer stage includes a stage mirror that is at a forty-five degree angle to the incoming laser beam (FIG. 1). A concern is that as the stage rotates, the alignment of the beam polarization to the s and p directions of the beam/mirror interface degrades, resulting in polarization rotation. In comparison, the embodiments of FIGS. 2, 3, 4 and 5 use stage reflective faces that are near normal to the incoming radiation, thereby minimizing the effects of polarization rotation.

Yet another advantage of the invention is that the dynamic range is improved. Some prior art approaches unintentionally introduce beam shear that is different for the two beams of an interferometer. By reducing the relative beam shear between the interfering beams, the present invention improves the dynamic range. Moreover, the reduction in the relative beam shear reduces the effect of wavefront-related measurement. Any walk-off of one beam relative to the other at the detector remains well within the acceptable tolerances for applications such as displacement of a wafer stage.

What is claimed is:

1. A system for acquiring position information relevant to a specific axis comprising:
   a movable apparatus having first and second reflective faces at a same side associated with a parallel to said specific axis, said first reflective face being at an angle to said second reflective face and said first and second reflective faces being non-parallel to said specific axis;
   an interferometer positioned to direct a first beam for impingement of said first reflective face and to direct a second beam for impingement of said second reflective face, said interferometer including a beam combiner aligned with a detector and aligned to combine said first and second beams; and
   beam-steering members located with respect to said interferometer and said first and second reflective faces to manipulate said first and second beams to reach said beam combiner without a beam path segment that varies in length in unity with displacements of said movable apparatus along said specific axis.

2. The system of claim 1 wherein said first and second reflective faces are surfaces that are angled such that beam paths of said first and second beams vary in opposition when said movable apparatus is displaced along said specific axis.

3. The system of claim 2 wherein said interferometer is configured to generate said first and second beams and to direct said first and second beams at a generally perpendicular angle with respect to displacement of said movable apparatus along said specific axis, said first and second reflective faces being oppositely angled as measured with respect to said perpendicular angle.

4. The system of claim 1 wherein said beam-steering members are mirrors that are positioned such that, when said movable apparatus is in a symmetry position on said specific axis, each beam path segment in which said first beam either impinges or has been reflected from said movable apparatus is symmetrical to a corresponding beam path segment of said second beam.

5. The system of claim 4 wherein said beam-steering members include first and second beam-return mirrors respectively aligned with and oriented to said first and second reflective faces to define return beam path segments, said first beam thereby reflecting from said first reflective face to said first beam-return mirror and being reflected back to said first reflective face, said second beam thereby reflecting from said second reflective face to said second beam-return mirror and being reflected back to said second reflective face.

6. The system of claim 5 wherein said first and second beam-return mirrors are in any orientation and are selected from at least one of the following types: reflective components, including plane mirrors and roof mirrors, refractive components, diffractive components, and holographic components.

7. The system of claim 1 wherein said movable apparatus is a support stage within a wafer lithography system having a lithography optical axis, said support stage being mounted for movement in directions perpendicular to said lithography optical axis and for movement aligned with said lithography optical axis, said specific axis being said lithography optical axis.

8. The system of claim 7 wherein said interferometer includes a laser source and a beam splitter that are cooperative to emit said first and second beams with differences in at least one of frequencies and polarization.

9. The system of claim 6 wherein said beam-steering members remain beyond reaches of said support stage in said X and Y directions as said support stage is displaced.

10. A method of utilizing an interferometric system to acquire position information of a movable apparatus along a specific axis comprising:
    directing first and second beams to impinge said movable apparatus;
    manipulating said first and second beams via reflections such that each beam path segment in which said first beam either impinges or has been reflected from said movable apparatus is symmetrical to a corresponding beam path segment of said second beam when said movable apparatus is in a beam symmetry position along said specific axis;
    combining said first and second beams as a basis for interferometrically acquiring said position information.

11. The method of claim 10 wherein directing said first and second beams toward said movable apparatus is a step in which said first and second beams are optically distinguishable with respect to at least one of frequency and polarization and wherein said movable apparatus is a wafer stage.

12. The method of claim 11 wherein manipulating said first and second beams includes positioning mirrors to define said beam path segments in which said first and second beams either impinge or have been reflected from said wafer stage, including locating said mirrors beyond ranges of motion of said wafer stage in directions perpendicular to said specific axis, said wafer stage including first and second reflective faces in alignment with said beam path segments.

13. The method of claim 12 wherein positioning said mirrors includes selecting said mirrors from at least one of the following types: reflective components, including plane mirrors and roof mirrors, refractive components, diffractive components, and holographic components.

14. The method of claim 10 wherein manipulating said first and second beams is implemented without maintaining a beam path segment that is parallel to said specific axis and that varies in length with displacement of said movable apparatus along said specific axis.

15. The method of claim 14 wherein manipulating said first and second beams includes providing said movable apparatus to include first and second reflective faces that are oppositely sloped with respect to a plane perpendicular to said specific axis.

16. A system for acquiring position information relevant to a specific axis comprising:
 a wafer stage movable in X and Y directions and in a perpendicular Z direction, said Z direction being aligned with a lithography exposure axis, wherein a perimeter is defined by extremes of travel of said wafer stage in said X and V directions, said wafer stage having first and second surfaces on a side thereof:
 a source of first and second beams, said first beam being directed to reflect from said first surface and said second beam being directed to reflect from said second surface;
 a plurality of optical members arranged to define first and second beam paths for said first and second beams following reflections from said first and second surfaces, said optical members being located beyond projections of said perimeter in said Z direction, wherein both of said first and second beam paths vary in length when said wafer stage is moved in said Z direction;
 a beam combiner at ends of said first and second beam paths to combine said first and second beams; and
 a processor operatively associated with said beam combiner for acquiring interferometry-based determinations regarding movements of said wafer stage in said Z direction.

17. The system of claim 16 wherein said source emits said first and second beams having different frequencies and different polarizations.

18. The system of claim 16 wherein said optical members include a first mirror aligned with and oriented to said first surface of said wafer stage to redirect said first beam back to said first surface, said optical members further including a second mirror aligned with and oriented to said second surface of said wafer stage to redirect said second beam back to said second surface.

19. The system of claim 18 wherein said first and second surfaces of said wafer stage are oppositely sloped with respect to a plane perpendicular to said Z direction.

20. The system of claim 19 wherein said opposite slopes are such that said first and second beam paths vary in opposition when said wafer stage is moved in said Z direction.

21. The system of claim 18 wherein said first and second mirrors for respectively redirecting said first and second beams are in any orientation and are selected from at least one of the following types: reflective components, including plane mirrors and roof mirrors, refractive components, diffractive components, and holographic components.

* * * * *

UNITED STATES PATENT AND TRADEMARK OFFICE
CERTIFICATE OF CORRECTION

| | |
|---|---|
| PATENT NO. | : 7,130,056 B2 |
| APPLICATION NO. | : 10/783199 |
| DATED | : October 31, 2006 |
| INVENTOR(S) | : Schluchter et al. |

It is certified that error appears in the above-identified patent and that said Letters Patent is hereby corrected as shown below:

Column 9, line 33, in Claim 16, delete "V" and insert -- Y --, therefor.

Signed and Sealed this

Twentieth Day of February, 2007

JON W. DUDAS
*Director of the United States Patent and Trademark Office*